(12) United States Patent
Chen (10) Patent No.: US 6,610,598 B2
(45) Date of Patent: Aug. 26, 2003

(54) SURFACE-MOUNTED DEVICES OF LIGHT-EMITTING DIODES WITH SMALL LENS

(75) Inventor: Hsing Chen, Jubei (TW)

(73) Assignee: Solidlite Corporation, Hsinchu (TW)

( * ) Notice: Subject to any disclaimer, the term of this patent is extended or adjusted under 35 U.S.C. 154(b) by 0 days.

(21) Appl. No.: 10/174,817

(22) Filed: Jun. 20, 2002

(65) Prior Publication Data

US 2003/0089914 A1 May 15, 2003

(30) Foreign Application Priority Data

Nov. 14, 2001 (TW) .................................. 90219747 U (51) Int. Cl.$^7$ ................................................ H01L 33/00
(52) U.S. Cl. ..................... 438/666; 438/82; 438/100; 438/676; 438/678
(58) Field of Search ................. 257/82, 95, 100, 257/666, 676, 678, 690, 710

(56) References Cited

U.S. PATENT DOCUMENTS 6,521,916 B2 * 2/2003 Roberts et al. ............. 257/100
6,531,328 B1 * 3/2003 Chen .......................... 438/26

* cited by examiner

Primary Examiner—Carl Whitehead, Jr.
Assistant Examiner—Thanh Nguyen
(74) Attorney, Agent, or Firm—Troxell Law Office PLLC

(57) ABSTRACT

The present invention is a surface-mounted device of light-emitting diodes (SMD LED) whose component typically has a plane on the surface. Through the calculation of Snell's Law, most of light fails to be emitted directly from the component because of the difference in the refractive index of the epoxy resin and the atmosphere (the refractive index of the light in the atmosphere is 1, the refractive index of the epoxy resin is around 1.5). It takes several times of refraction and a waste of brightness to allow the light that fails to be emitted directly a chance to be emitted, while leaving some light that might never be emitted. Therefore, the brightness reduces.

The surface-mounted devices of light-emitting diodes with small lens for the present invention attach several small lens or diffraction lens on the plane surface of the SMD LED. The lens that enlarges the critical angle increases the direct light-emitting opportunity from the light-emitting chip, which in turn increases the brightness of LED. Besides, the plane surface of the component under the vision of naked eyes wards off the influence on the pick and place operation, while prevents the volume of the component from getting large.

8 Claims, 9 Drawing Sheets

SURFACE-MOUNTED DEVICES OF LIGHT-EMITTING DIODES WITH SMALL LENS

BACKGROUND OF THE INVENTION

Figure 1:
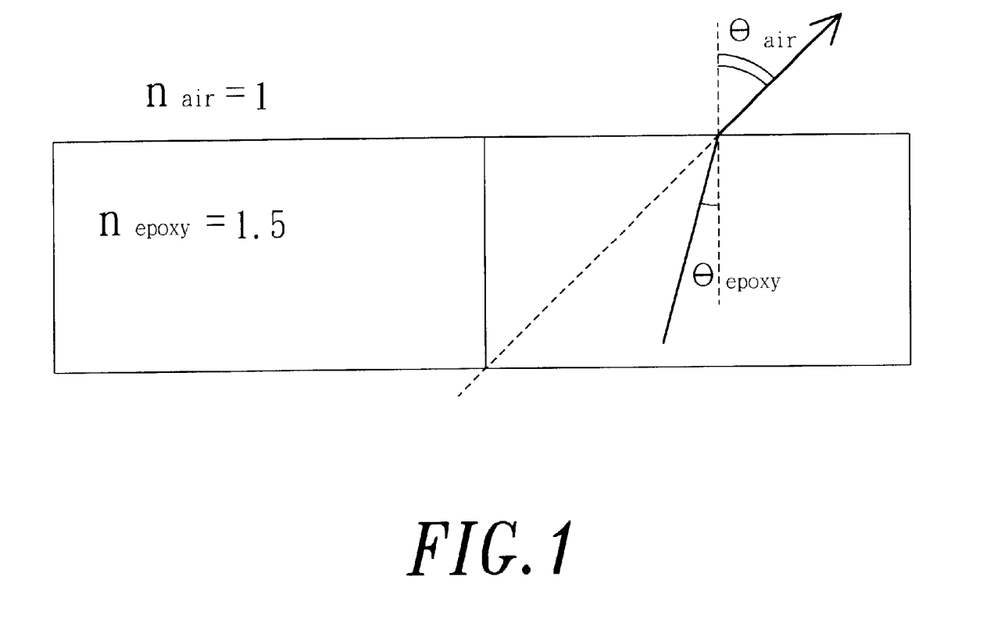
FIG. 1 is an illustrative diagram of Snell's Law.

Current surface-mounted devices of light-emitting diodes (SMD LED) fail to emit most of the light because of the difference in the refractive index of the epoxy resin and the atmosphere during the packaging process (The $n_{air}$ refractive index of the atmosphere is 1, and the $n_{epoxy}$ refractive index of the epoxy resin is around 1.5). This is evidential as follows:

For a plane surface of the component, the Snell's Law shows:

$$n \sin(\theta) =' \sin(\theta)$$

then $$n_{air} \sin(\theta_{air}) = n_{epoxy} \sin(\theta_{epoxy}); n_{air}=1 \text{ (as shown in FIG. 1)}$$

$$\sin(\theta_{air}) = 1.5 \times \sin(\theta_{epoxy})$$

In this example, the maximum angle $\theta_{air}$ of the light injected from the epoxy resin to the atmosphere is 90°. The calculating formula states as follows:

$$\mathrm{Sin}(90°) = 1.5 \times \sin(\theta_{epoxy})$$

$$\theta_{epoxy} = \sin^{-1}(1/1.5) = 0.729728 = 0.728728 \times 180/\pi = 41.8°$$

Figure 2:
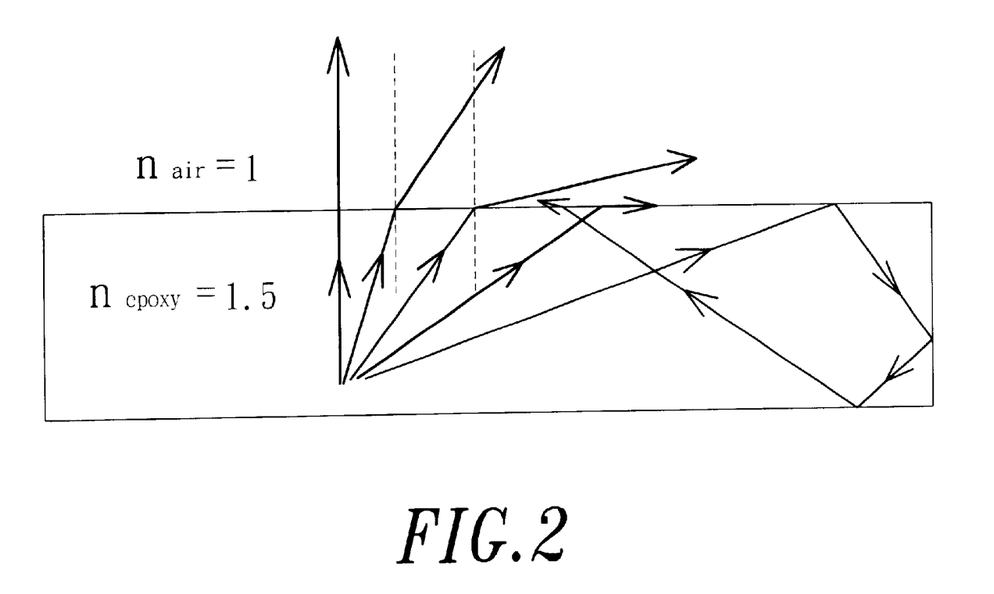
FIG. 2 is a diagram that shows the light larger than the critical angle fails to emit directly from the component.

Here, 41.8° stands for the critical angle. In other words, a LED light-emitting chip emits 180° of light, yet only 41.8°×2=83.6° of the light is injected directly from the component. Other light has to be injected (or might even be blocked completely from injecting) after several times of refraction and a loss of brightness, which reduces the efficiency of the brightness (as shown in FIG. 2).

Figure 3:
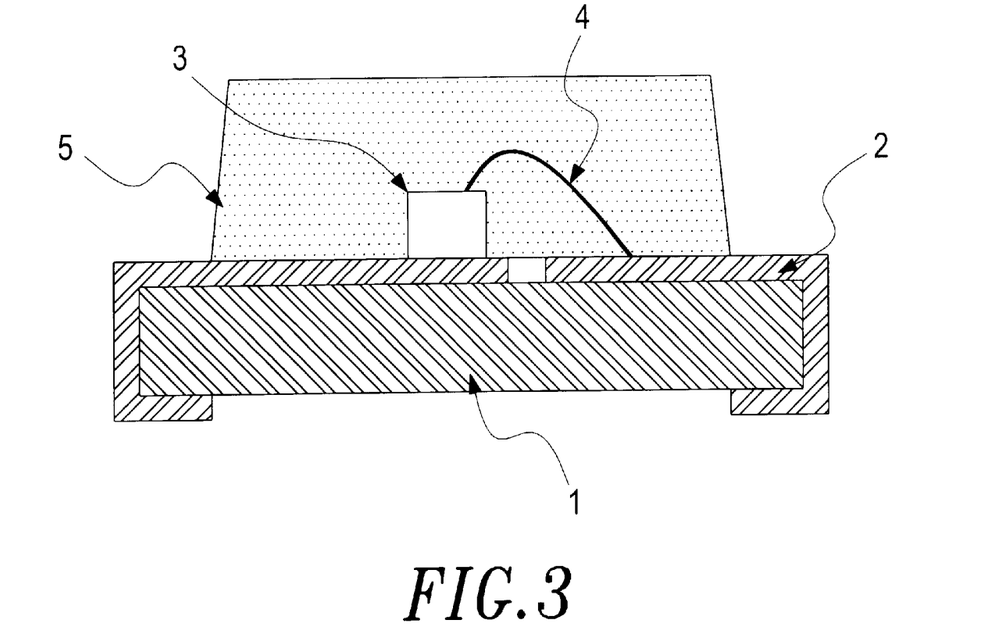
FIG. 3 is a cross-sectional diagram of the traditional plane surface-mounted devices of light-emitting diodes (SMD LED).
Figure 4:
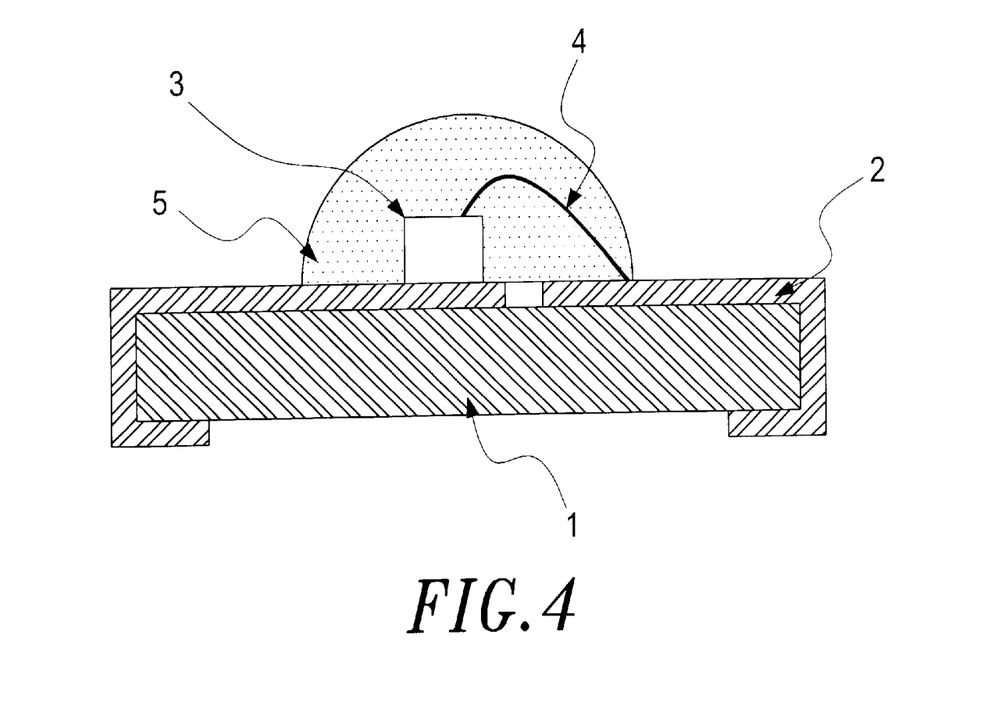
FIG. 4 is a cross-sectional diagram of traditional convex SMD LED.
Figure 5:
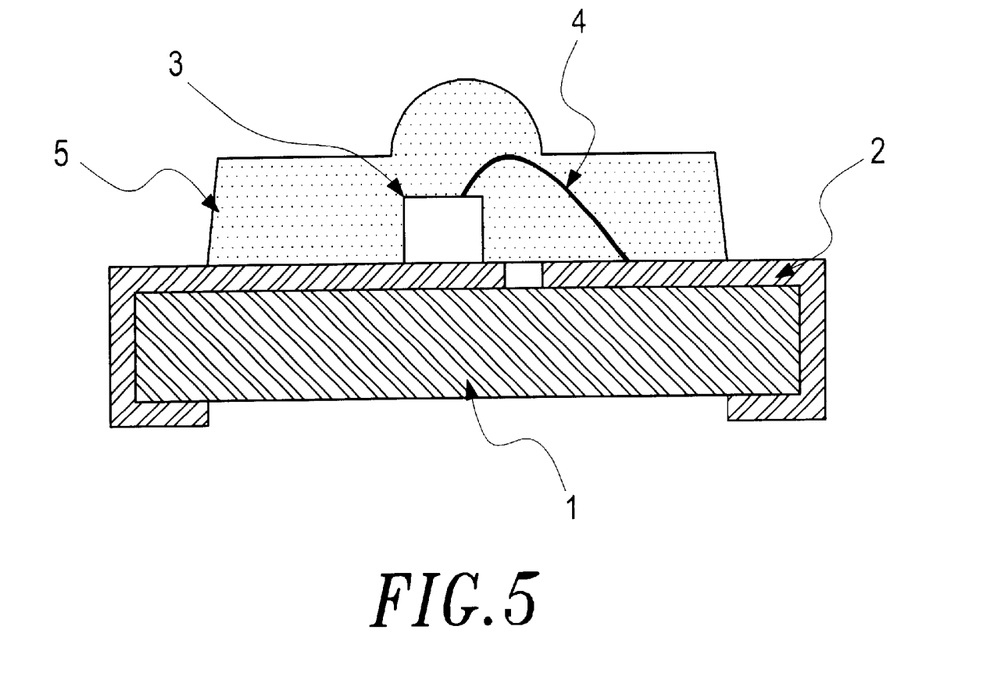
FIG. 5 is a cross-sectional diagram of traditional compounded SMD LED.

Present SMD LED is subjected to the molding technology and the cost. The appearance of traditional epoxy resin is no more than plane convex and a compound of both as shown in FIGS. 3, 4 and 5. A single convex surface increases the volume of the product, despite of its improvement in the brightness of the light. The most serious disadvantage is that during the pick and place operation of the LED component, the vacuum extractor tends to leak out the air due to the convex surface of the component, which causes insufficient vacuum, loss of the material during operation and slants of the location. In sum, the disadvantages of traditional SMD LED mentioned above include:
1. Low brightness effect
2. The convex surface of the encapsulating resin of SMD LED enhances the brightness; however, the design increases the volume of the component.
3. The convex component of SMD LED causes a loss of material during the pick and place operation, which even causes the machine to break down.
4. The convex component of SMD LED causes displacement during the pick and place operation and brings more trouble to the operation.

SUMMARY OF THE INVENTION

The surface-mounted devices of light-emitting diodes with small lens for the present invention uses dedicated molding. Each lens possesses a diameter between 10 um to 200 um, which is hard to make by traditional machines. Such molding that forms small lens makes use of Lithographice Galvanoformung and Abformung (LIGA) that develops the image by the exposing of the resist and then shapes the remained photoresist into spherical surface by heating. After being plated with metal conducting layer, the SMD LED with small lens are molded.

The molding by Lithographice Galvanoformung and Abformung transcends traditional molding machines and manufactures molds with small lens that traditional machine and processing technology could never achieves, so as to apply them to the packaging (such as: molding). In this way, small lens can be equipped on the surface of SMD LED.

The surface of SMD LED attached with small lens enhances the critical angle of the light emitted from the light-emitting chip (dice). Therefore, by collecting the light from the light-emitting chip (dice), the brightness is enhanced and the direction of the light becomes more centralized.

By designing the small lens into diffraction lens that provides diffraction function to focus the light, the light on each spot of the packing resin (Epoxy) is focused on the focus after passing through the diffraction lens, which in turn achieve the goal of increasing brightness.

Meanwhile, since the surface of SMD LED appears to be plane under the vision of naked eyes, the user doesn't have to worry about the insufficiency of vacuum caused by the vacuum extractor's leaking air during the pick and place operation that might lead to a loss of materials and displacement during the operation, and brings trouble to the follow-up replenishment and operation.

The SMD LED with small lens possess the following advantages:
1. Conserve each advantage of the SMD LED
2. Increase the brightness of LED. Centralize the direction of the light.
3. Prevent the volume of the component from increasing during the process of increasing the brightness.
4. Keep the vision on the plane surface. Improve the efficiency and quality during the fixing operation of the component.

Following is the illustrative diagram and description of the surface-mounted devices of light-emitting diodes for the present invention.

DETAILED DESCRIPTION OF THE INVENTION

Figure 6:
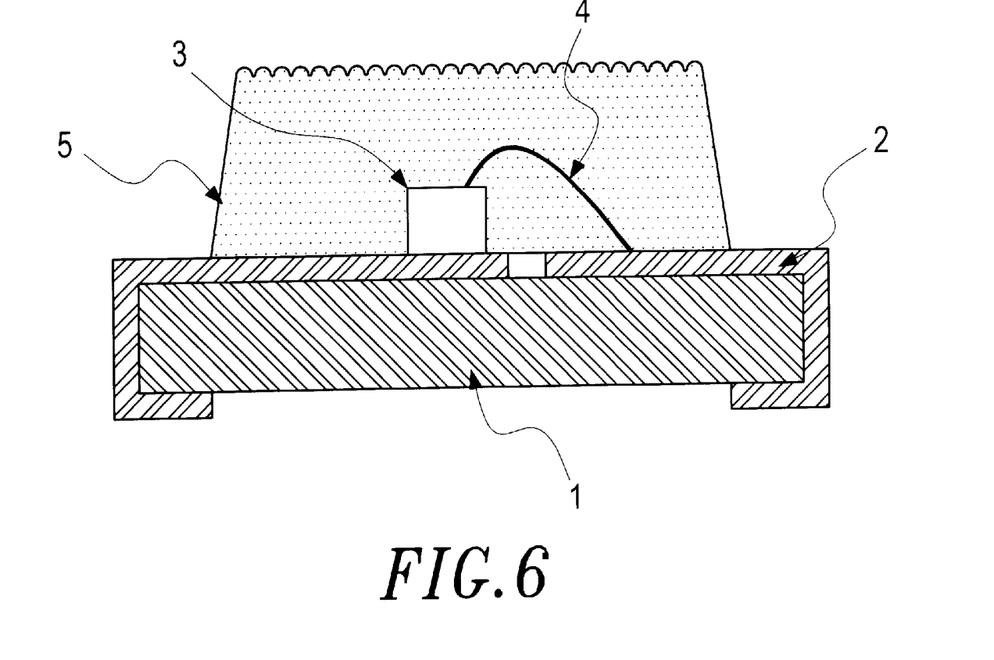
FIG. 6 is a cross-sectional diagram of SMD LED with small lens in the present invention.
Figure 7:
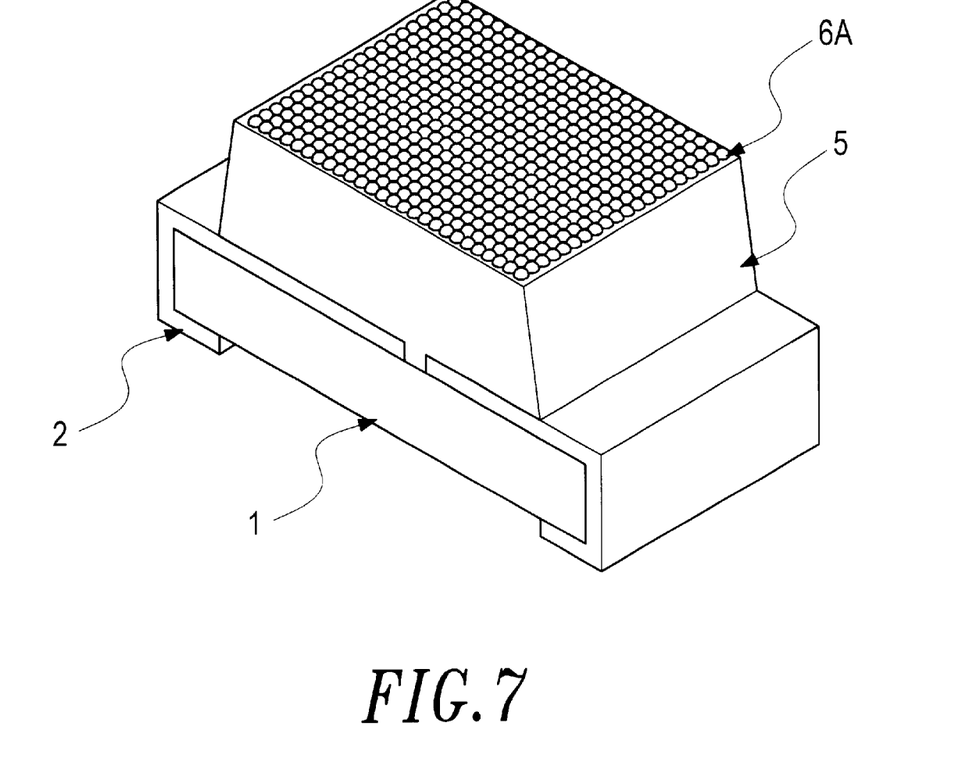
FIG. 7 is a three-dimensional diagram of the SMD LED with several small lens in array in the present invention.
Figure 8:
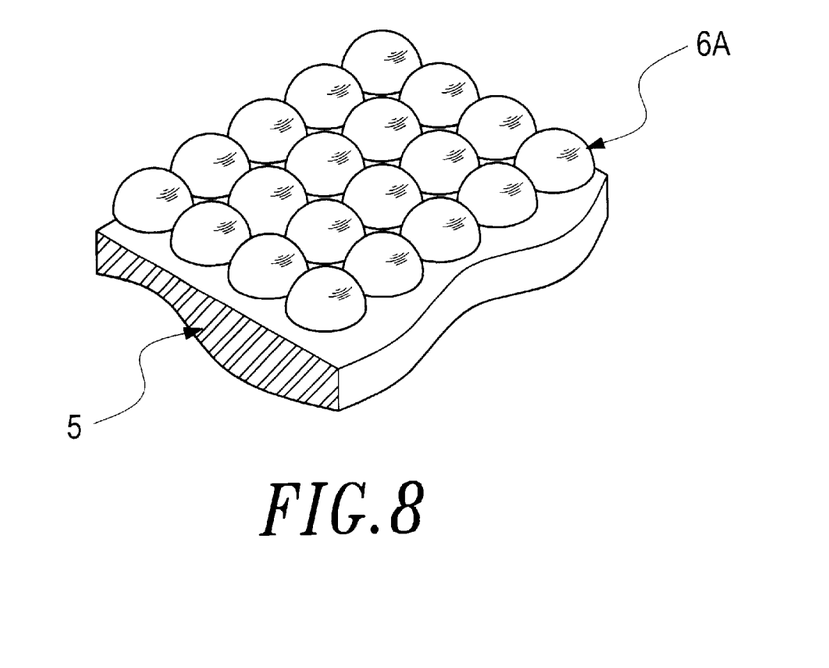
FIG. 8 is a magnifying diagram of the lens on the SMD LED with small lens arranged in arrays.

Please refer to FIGS. 6, 7 and 8 for the small lens arranged in arrays in the present invention 6A. This structure is a surface composed of several small lens that collect most of the light inside the component and then emit. This is because the convex surface of the small lens enlarges the critical angle, which means enlarging the angle inside the component that allows it to emit the light effectively, and then increase the brightness of the entire SMD LED. Although the lens appears convex with a diameter between 10 um to 20 um, the small and concentrated arrangement makes its appearance a plane under the naked eyes. Hence, the situations of a loss of materials caused by the vacuum extractor's leaking air, displacement and broken-down machines during the pick and place operation are avoided.

Figure 9:
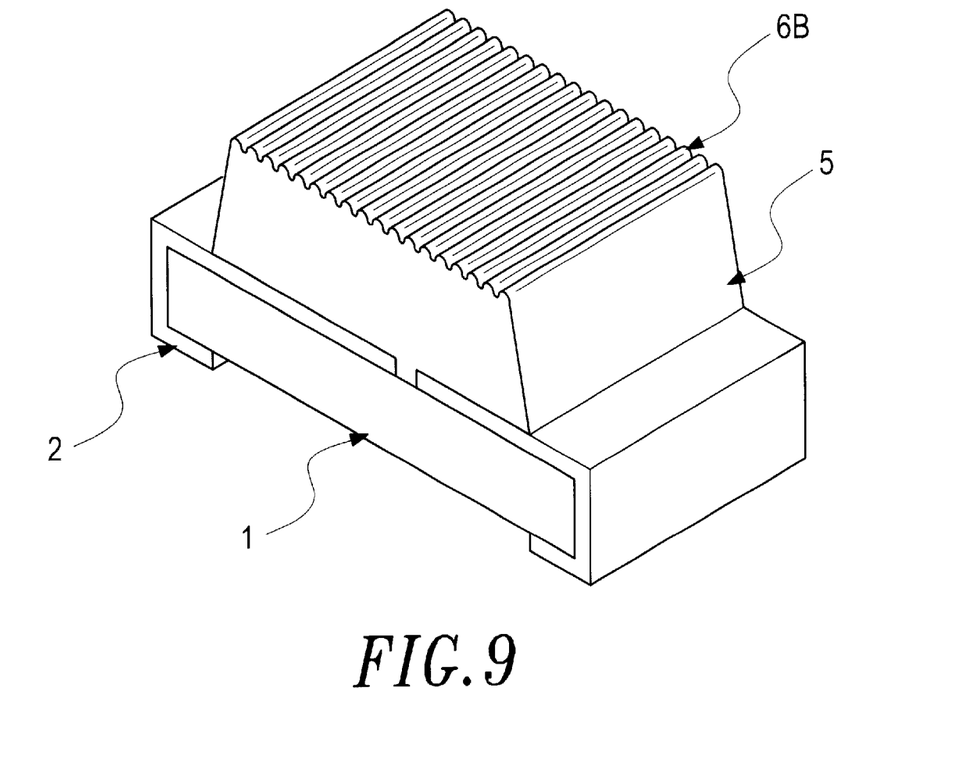
FIG. 9 is a three-dimensional diagram of the lens on the SMD LED with small lens arranged in pillars.
Figure 10:
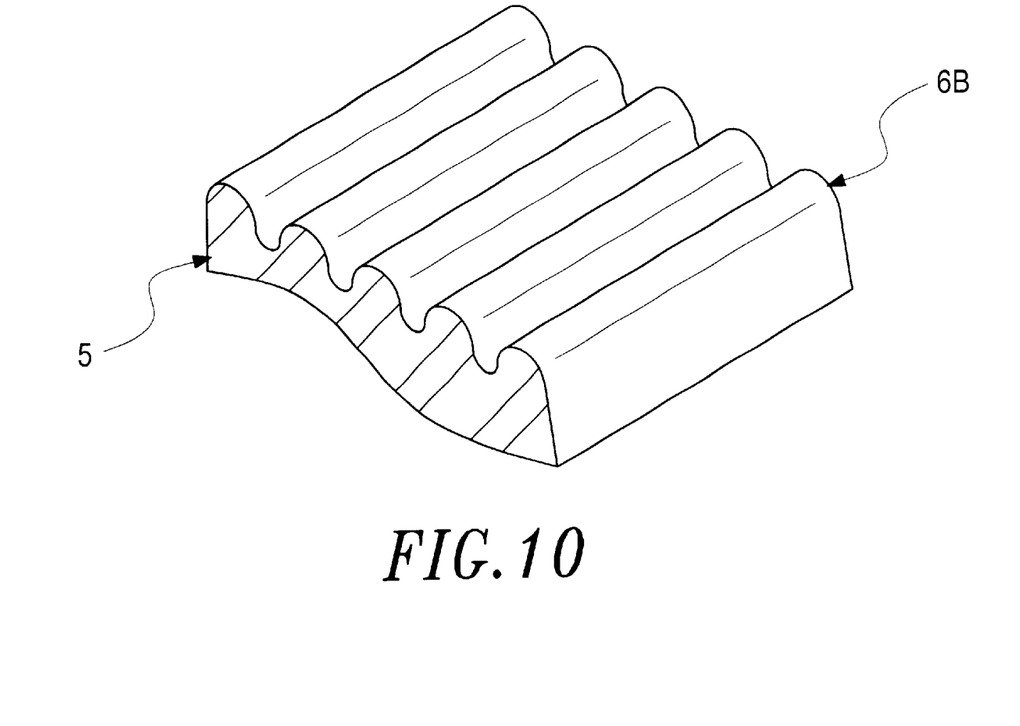
FIG. 10 is a partial magnifying diagram of the lens on the SMD LED with small lens arranged in pillars.

Please refer to FIGS. 9 and 10 for the small lens of the "surface-mounted devices of light-emitting diodes with small lens" arranged in pillars for the present invention 6B. As mentioned above, this structure can also emit the light to increase the brightness of the SMD LED.

Figure 11:
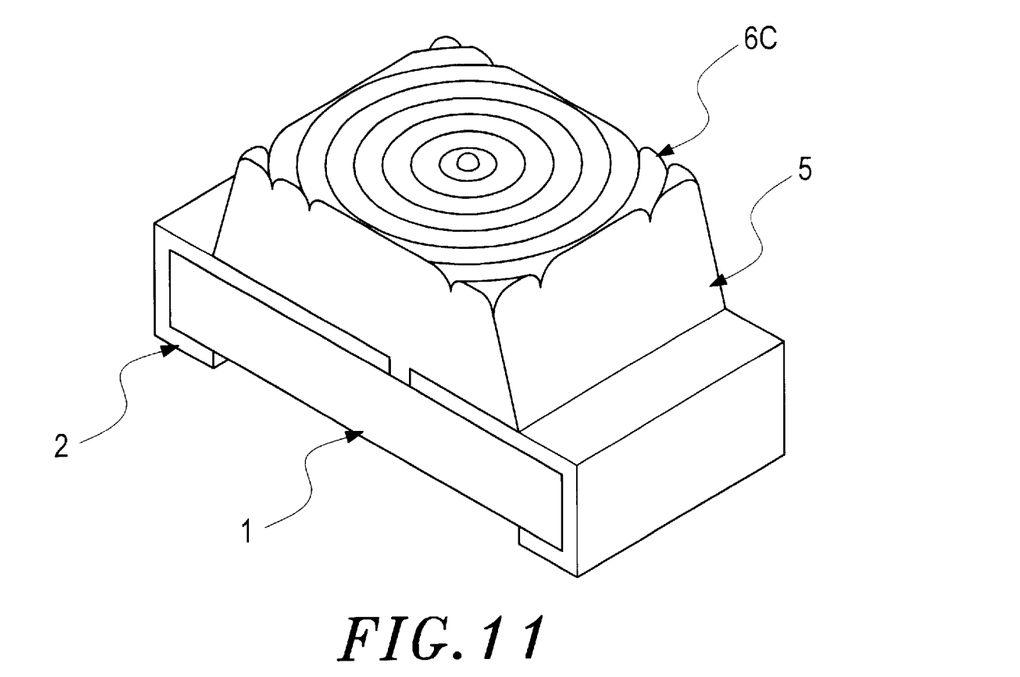
FIG. 11 is a three-dimensional diagram of the SMD LED with small lens arranged in concentric circles.

Please refer to FIG. 11 for the present invention in which the small lens are arranged in concentric circles 6C. This arrangement can collect most of the upward light inside the component and emit. Similarly, the delicate lines do not influence the pick and place operation of the component.

Figure 12:
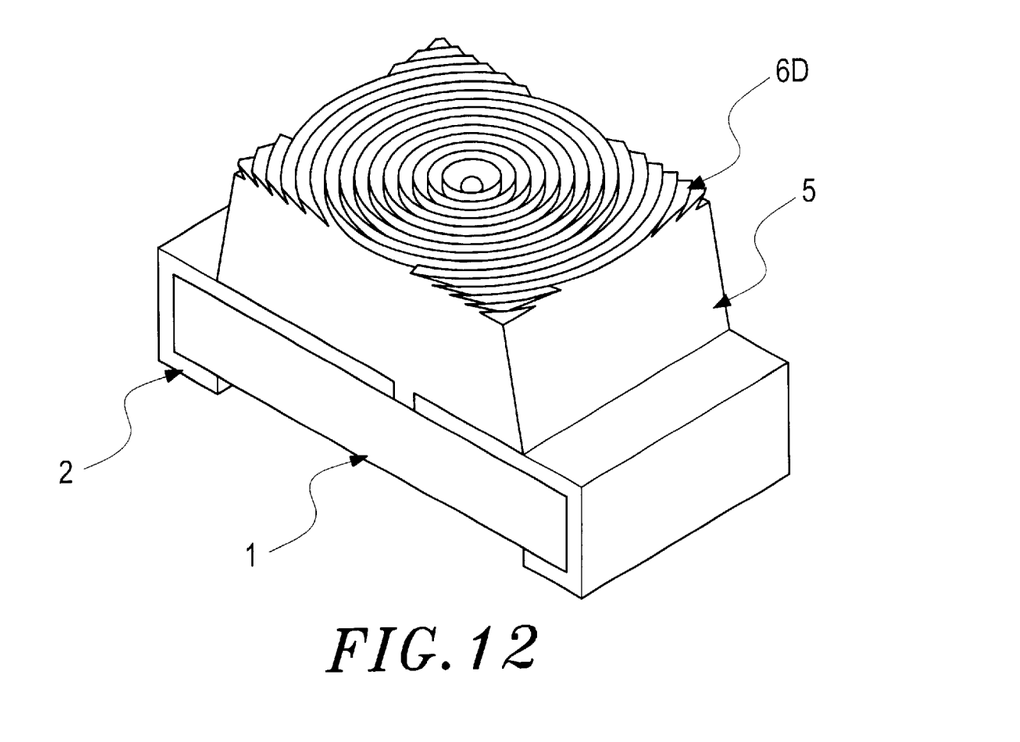
FIG. 12 is a three-dimensional diagram of the SMD LED with diffraction lens on the surface in the present invention.
Figure 13:
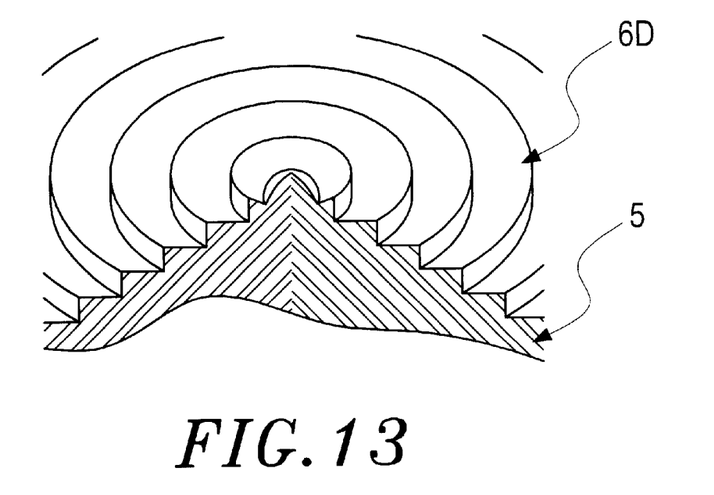
FIG. 13 is a magnifying diagram of the lens on the SMD LED with diffraction lens in the present invention.

Please refer to FIGS. 12 and 13 for the present invention in which the small lens are designed as diffraction lens that provide diffraction function 6D. Such arrangement that provides focusing effect allows the light emitted from each part of the component to focus on the same spot through the lens, which increases the brightness of the light.

Figure 14:
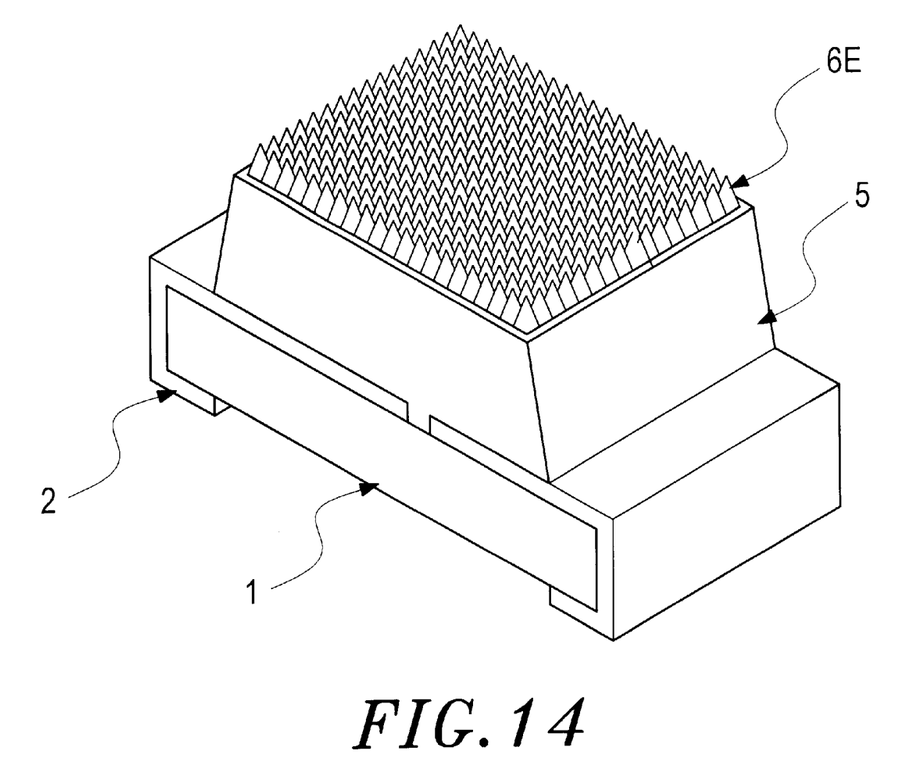
FIG. 14 is a three-dimensional diagram of the SMD LED with small diamond lens arranged in arrays in the present invention.
Figure 15:
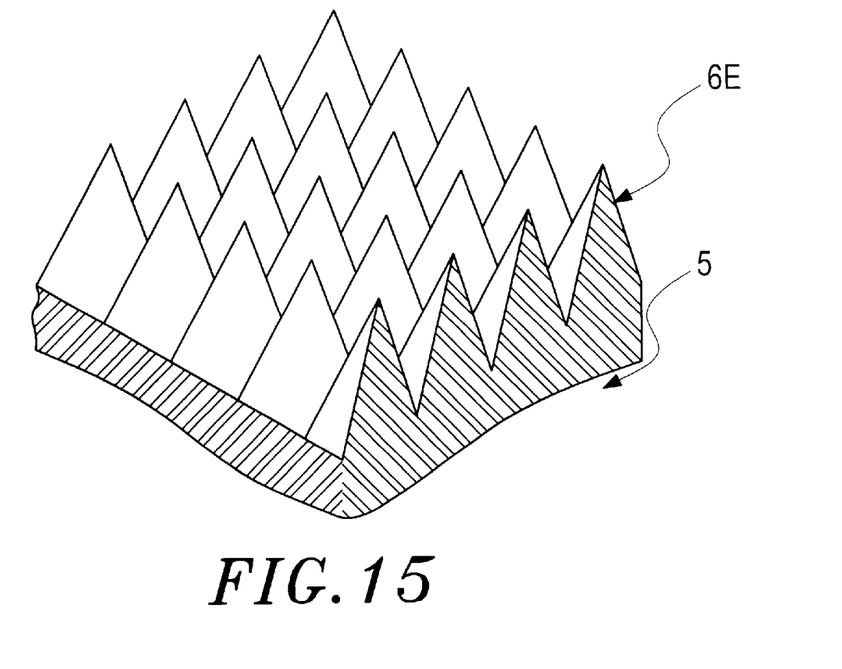
FIG. 15 is a partial magnifying diagram of the small lens in FIG. 14.

Please refer to FIGS. 14 and 15 for the present invention in which the small diamond lens are arranged in arrays 6E. This design makes use of the four faces of the diamond lens to capture the light and emit the light from the component. This diamond structure is formed with the super-delicate processing molding or micro electro mechanical systems (MEMS) that expose, develop and etch the silicon chips. The 70-degree diamond lens are etched from the silicon chips in accordance with the [100] surface orientation of the Si chips and then molded by electroforming.

Figure 16:
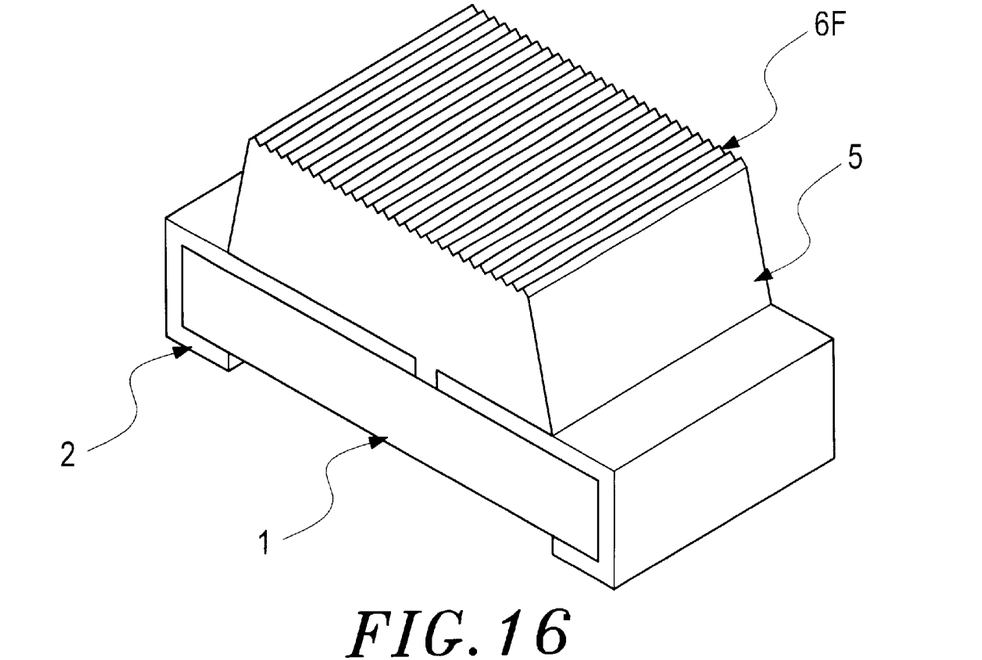
FIG. 16 is a three-dimensional diagram of the SMD LED with small diamond lens arranged in pillars in the present invention.
Figure 17:
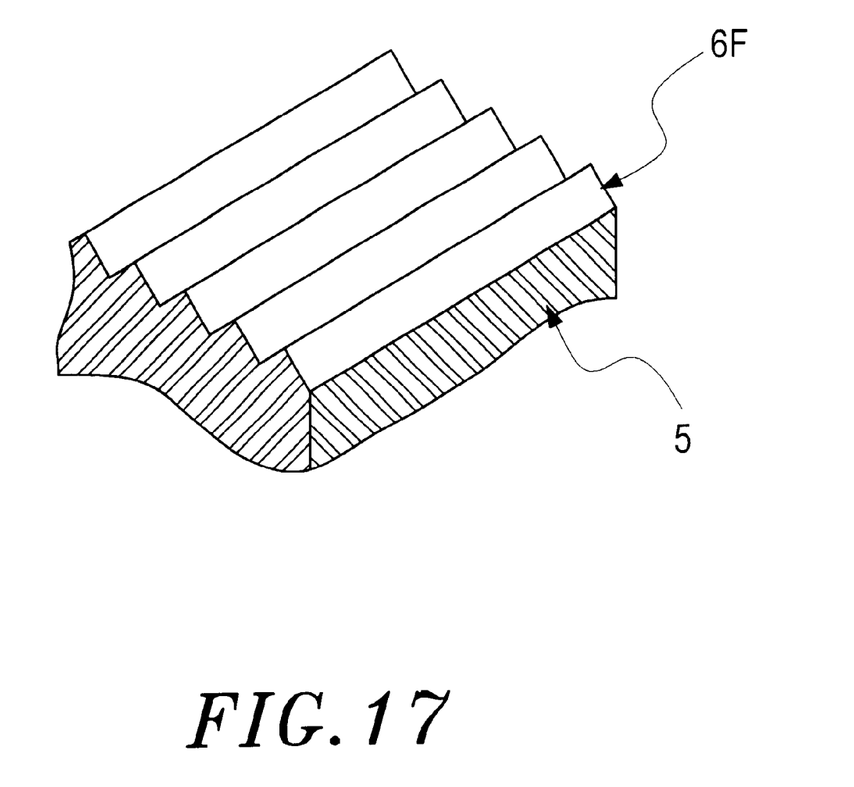
FIG. 17 is a partial magnifying diagram of the small lens in FIG. 16.

Please refer to FIGS. 16 and 17 for the small diamond lens arranged in pillars in the present invention 6F. The diamond lens collects the light in the components and then emits. Such a design resembles to the diamond plate on the LCD panel that improves the brightness.

In sum, the surface-mounted devices of light-emitting diodes with small lens for the present invention is an innovative and improved invention that makes small lens molding with the latest Lithographice Galvanoformung and Abformung (LIGA) technology, as well as Micro Electro mechanical Systems Workshop (MEMS) for small diamond lens molding, which increase the brightness of the SMD LED that adds more practical efficiency and fit into with the requirements of applying for patent.

What is claimed is:

1. Surface-mounted devices of light-emitting diodes with small lens, consisting of:
    lead frame or substrate, with electric conducting electrode fitted on it;
    light-emitting chip, usually with D.C passing through its positive and negative electrodes to emit light of specific wavelength;
    electric conducting wire or material, used for connecting said light-emitting chip and said lead frame or substrate;
    encapsulating resin, used for protect said light-emitting chip and electric conducting wire or materials;
    with said electric conducting material or adhesive, fix said light-emitting chip on said lead frame or machine plate, then, connecting positive and negative electrodes of said light-emitting chip and electric conducting electrodes on said substrate by welding, next, with molding for encapsulating resin to wrap said light-emitting chip and electric conducting wires into SMD LED characterized with several small lens on surface, with this design to enhance brightness and centralize direction of light.

2. The surface-mounted devices of light-emitting diodes with small lens of claim 1, wherein said small lens can be convex lens arranged in arrays.

3. The surface-mounted devices of light-emitting diodes with small lens of claim 1, wherein said small lens can be convex lens arranged in pillars.

4. The surface-mounted devices of light-emitting diodes with small lens of claim 1, wherein said small lens can be convex lens arranged in concentric circles.

5. The surface-mounted devices of light-emitting diodes with small lens of claim 1, wherein said small lens can be diffraction lens providing diffraction function, such lens offers focusing effect focusing light emitted from each part of component on a same spot to increases brightness.

6. The surface-mounted devices of light-emitting diodes with small lens of claim 1, wherein said small lens can be diamond lens arranged in arrays.

7. The surface-mounted devices of light-emitting diodes with small lens of claim 1, wherein said small lens can be triangular prism.

8. The surface-mounted devices of light-emitting diodes with small lens of claim 1, wherein diameter of said small lens falls between 10~200 um and diameter of said small diamond lens falls between 10~200 um.

* * * * *